US006028879A

United States Patent [19]
Ershov

[11] Patent Number: 6,028,879
[45] Date of Patent: Feb. 22, 2000

[54] NARROW BAND LASER WITH ETALON BASED OUTPUT COUPLER

[75] Inventor: Alexander I. Ershov, San Diego, Calif.

[73] Assignee: Cymer, Inc., San Diego, Calif.

[21] Appl. No.: 09/204,111

[22] Filed: Dec. 2, 1998

Related U.S. Application Data

[63] Continuation-in-part of application No. 08/869,239, Jun. 4, 1997, Pat. No. 5,856,991, and application No. 08/886,715, Jul. 1, 1997, Pat. No. 5,970,082, and application No. 08/926,721, Sep. 10, 1997, Pat. No. 5,852,627, and application No. 08/987,127, Dec. 8, 1997, Pat. No. 5,901,163.

[51] Int. Cl.[7] .................................................. H01S 3/22
[52] U.S. Cl. ............................. 372/57; 372/98; 372/20; 372/92; 372/19
[58] Field of Search ................................ 372/92, 57, 20, 372/98, 19, 102, 100

[56] References Cited

U.S. PATENT DOCUMENTS

| | | | |
|---|---|---|---|
| 4,360,925 | 11/1982 | Brosnan et al. | 372/95 |
| 4,868,515 | 9/1989 | Reintjes et al. | 330/4.3 |
| 4,947,398 | 8/1990 | Yasuda et al. | 372/29 |
| 5,095,487 | 3/1992 | Meyerhofer et al. | 372/23 |
| 5,216,680 | 6/1993 | Magnusson et al. | 372/20 |
| 5,596,596 | 1/1997 | Wakabayashi et al. | 372/102 |
| 5,761,236 | 6/1998 | Kleinschmidt et al. | 372/100 |
| 5,852,627 | 12/1998 | Ershov | 372/108 |
| 5,856,991 | 1/1999 | Ershov | 372/57 |
| 5,901,163 | 5/1999 | Ershov | 372/20 |

OTHER PUBLICATIONS

Magni, et al., "Resonators with Variable Reflectivity Mirrors", in the Physics and Technology Laser Resonators, (Bristol and New York: Hilger 1989), pp. 94–105.

Shaw, "Excimer Laser Resonators", in the Physics and Technology of Laser Resonators, (Bristol and New York: Hilger 1989), pp. 237–245.

Sengupta, "Krypton fluoride excimer laser for advanced microlithography", Optical Engineering, vol. 32, No. 10, Oct. 1993, pp. 2410–2420.

Giuri, et al., "Output coupler design of unstable cavitties for excimer lasers", Applied Optics, vol. 26, No. 6, Feb. 20, 1997, pp. 1143–1148.

*Primary Examiner*—Leon Scott, Jr.
*Attorney, Agent, or Firm*—John R. Ross, Esq.

[57] ABSTRACT

A line narrowed laser having a grating based line narrowing module, etalon-based line narrowing output coupler and a technique for tuning the laser. The etalon based output coupler is adjusted to preferentially reflect light at or near the spectral maximum produced by the grating. Substantial improvement in line narrowing results from the amplification in the laser resonance chamber of light at or near the grating spectral maximum which is preferentially reflected by the etalon based output coupler. Several preferred methods are disclosed for tuning the etalon based output coupler to match the wavelength selected by the grating based line narrowing module.

8 Claims, 19 Drawing Sheets

NARROW BAND LASER WITH ETALON BASED OUTPUT COUPLER

This application is a continuation-in-part application of U.S. Ser. No. 08/869,239, filed Jun. 4, 1997 (now U.S. Pat. No. 5,856,991, issued Jan. 5, 1999); U.S. Ser. No. 08/886,715, filed Jul. 1, 1997; U.S. Ser. No. 08/926,721, filed Sep. 10, 1997 (now U.S. Pat. No. 5,852,627, issued Dec. 22, 1998); and U.S. Ser. No. 08/987,127, filed Dec. 8, 1997 (now U.S. Pat. No. 5,901,163 issued May 4, 1999). This invention relates to line narrowed lasers and especially to grating and etalon-based line narrowed excimer lasers.

BACKGROUND OF THE INVENTION

TECHNIQUES FOR LINE NARROWING

Techniques for decreasing the bandwidth of the output of lasers are well known. Several such techniques used on excimer lasers are discussed by John F. Reintjes at pages 44–50 in *Laser Handbook*, Vol. 5, North-Holland Physics Publishing, Elsevier Science Publishers B.V. These techniques include the utilization of gratings, including echelle gratings for wavelength selection. Use of beam expanding prisms ahead of the grating can increase the effectiveness of the grating.

A prior art narrow band KrF excimer laser is shown in FIG. 1. The resonance cavity of excimer laser 2 is formed by output coupler 4 (which is a partially reflecting mirror) and echelle grating 16. A portion of the laser output beam 20 (having a cross section of about 3 mm in the horizontal direction and 20 mm in the vertical direction) exits the rear of laser chamber 3. This portion of the beam is expanded in the horizontal direction by prisms 8, 10 and 12 and reflected by mirror 14 onto echelle grating 16. Mirror 14 is pivoted to select the narrow band output for laser 2. Grating 16 is arranged in Littrow configuration so that the selected narrow band of wavelengths is reflected back off mirror 14 and back through prisms 12, 10 and 8 and into chamber 3 for amplification. Light at wavelengths outside the selected narrow band is disbursed so that this disbursed out-of-band light is not reflected back into the laser chamber. Total beam expansion for this laser is about 20×. The beam has a horizontal polarization (P-polarization for the prisms with the actual surface arranged vertically). Typical KrF lasers operating in a pulse mode may have a cavity length of about 1 m and produce pulses having a duration of about 15 to 25 ns. Thus, photons within the resonance cavity will make, on the average, about 3 to 5 round trips within the cavity. On each round trip, about 90 percent of the beam exits at the output coupler and about 10 percent is sent back for further amplification and line narrowing. The beam is repeatedly line narrowed as it passes through the line narrowing module.

With this prior art arrangement, the bandwidth of the KrF laser is reduced from its natural bandwidth of about 300 pm (full width half maximum or FWHM) to about 0.8 pm for KrF lasers and about 0.6 pm for ArF lasers. Another important measure of the pulse quality is referred to as the "95% integral". This is the spectral width of the portion of the pulse containing 95% of the pulse energy. Prior art KrF laser can provide "95% integral" values of around 3 pm over the lifetime of the laser and prior art ArF lasers can provide 95% integral values of about 1.5 pm.

Some applications of KrF lasers, however, require greater narrowing of the bandwidth. There is a need for smaller bandwidths such as FWHM values of 0.5 pm and 0.4 pm for KrF and ArF, respectively, and 95% integral values of 2.0 pm and 1.0 pm, respectively.

One prior art method is to add an etalon within the resonance cavity, In this case, the etalon is operated in a transmissive mode and the light is additionally line narrowed as it passes through the etalon. In such system one should use a relatively high finesse etalon, with a finesse value $f$ of about 1 or higher which produces sharp fringe patterns. The finesse value $f$ is determined by the equation:

$$f = \pi r^{1/2}/(2-r)$$

where r is the reflectivity of the etalon surfaces. The dependence of etalon transmission spectrum on r is shown graphically in FIG. 2 which is extracted from page 298 of *Fundamentals of Optics* by Jenkins and White, published by McGraw Hill. From FIG. 2, it is obvious why prior art transmissive etalons used for line narrowing have surfaces with reflectance of about 50% to 80% (see curves B and C of FIG. 2). FIG. 2 also shows that it would not be practical to use curve A-type low finesse etalon as it line-narrowing efficiency in this prior art arrangement would be very low. Prior art high finesse etalons used with diffraction gratings should enhance the line-narrowing capabilities provided by diffraction grating, and in general, improves the laser linewidth. The major disadvantages of this technique are that the many reflections within the etalon tend to heat up the etalon producing distortions and that the tuning of the etalon synchronously with the grating does present a real technical challenge and is difficult to accomplish in practice.

What is needed is a better technique for line narrowing and tuning of lasers.

SUMMARY OF THE INVENTION

The present invention provides a line narrowed laser having a grating based line narrowing module, etalon-based line narrowing output coupler and a technique for tuning the laser. The etalon based output coupler is adjusted to preferentially reflect light at or near the spectral maximum produced by the grating. Substantial improvement in line narrowing results from the amplification in the laser resonance chamber of light at or near the grating spectral maximum which is preferentially reflected by the etalon based output coupler. Several preferred methods are disclosed for tuning the etalon based output coupler to match the wavelength selected by the grating based line narrowing module.

DETAILED DESCRIPTION OF THE PREFERRED EMBODIMENTS

KrF Excimer Laser

A very narrow-band KrF laser utilizing the features of the present invention is described below. (The reader should understand that the principle of this invention can be applied to ArF excimer lasers and to $F_2$ lasers merely by utilizing gratings, etalons and other optical components selected for use at the shorter wavelengths of ArF and $F_2$ lasers.

The Chamber

Figure 3A:
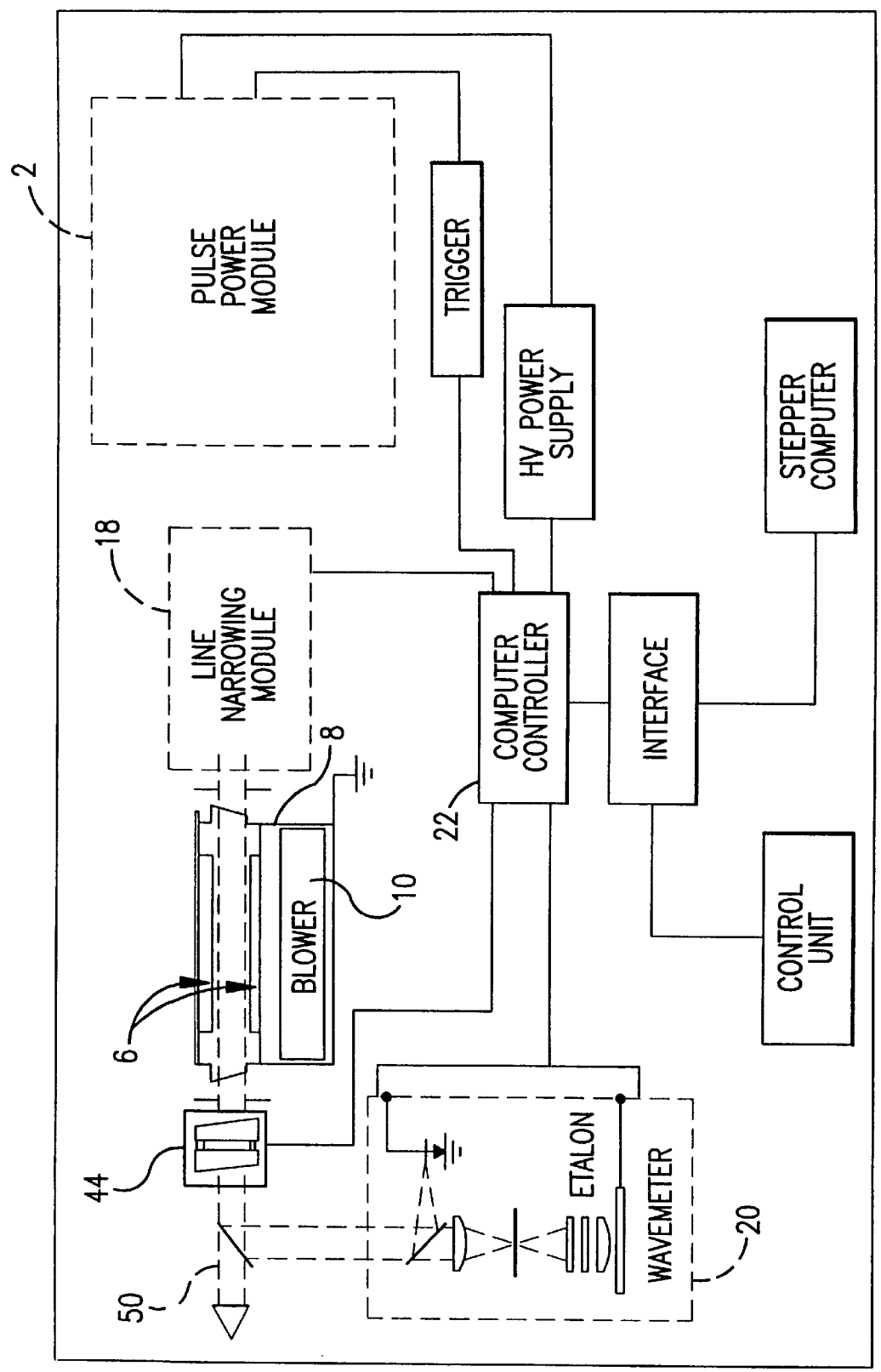
FIG. 3A shows a line narrowed excimer laser with etalon output coupler.

The discharge chamber 8 of a preferred embodiment of the present invention, shown in FIG. 3A, is the same as prior art discharge chambers. The chamber 8 is a vessel, designed to hold several atmospheres of corrosive gases. A discharge region is defined by the two electrodes 6 separated by a gap of 1.2 to 2.5 cm. The cathode is supported by an insulating structure since it is connected to the high voltage, while the anode is attached to the metal chamber which is at ground potential. Preionization is done by corona discharge preionizers located on either side of the discharge region. Due to the corrosive nature of the laser gas, the chambers use particular metals chosen to resist fluorine attack. The fluorine gas however, still reacts with the chamber internal parts such as chamber walls and electrodes; thus consuming fluorine and generating metal fluoride contaminants. Metal fluoride dust is trapped by means of an electrostatic precipitator not shown. A small amount of laser gas is extracted from the chamber and is passed over negatively charged high field wires to trap the dust. The dust-free gas is then released over the windows to keep them clean.

Pulse Power Module

Figure 3B:
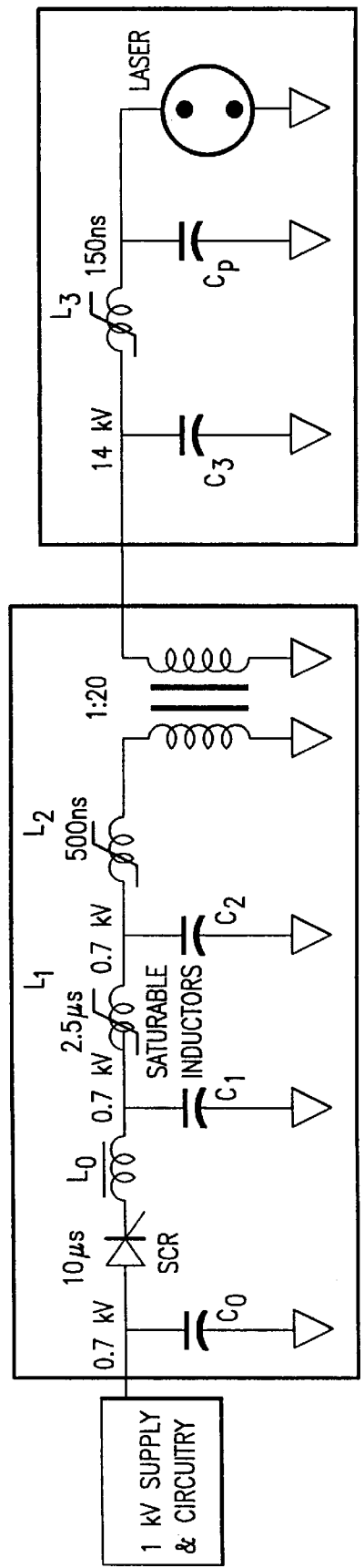
FIG. 3B shows a solid state pulse power module used by the FIG. 3A laser.

This preferred embodiment utilizes a solid state pulsed power module (SSPPM) circuit shown in FIG. 3B. It switches the energy of capacitor $C_0$ charged by a 1 kV power supply into a pulse compression circuit formed by capacitors $C_1$, $C_2$, $C_3$, a step-up transformer, and three saturable inductors $L_1$, $L_2$ and $L_3$. The operation of this circuit is as follows. The DC charge stored on $C_0$ is switched through the SCR and the inductor $L_0$ into $C_1$. The saturable inductor, $L_1$, holds off the voltage on $C_1$ for approximately 2.5 μs and then becomes conducting, allowing the transfer of charge from $C_1$ to $C_2$. The second saturable inductor, $L_2$, holds off the voltage on $C_2$ for approximately 500 ns and then allows the charge on $C_2$ to flow through the primary of 1:20 step-up transformer. The output from the step-up transformer is stored on $C_3$ until the saturable inductor $L_3$ becomes conducting in approximately 100–150 ns. The charge is then finally transferred through $L_3$ into $C_p$ and laser discharge occurs.

Spectral Narrowing

Spectral narrowing of a KrF laser is complicated by its short pulse duration (20 to 30 ns, FWHM) and UV wavelength. The short pulse results in very high intra-cavity power (~1 MW/cm²), and the short wavelength can thermally distort optical materials due to their high absorption co-efficient at 248 nm. Also, the total number of round trips through the resonator (which includes the line narrowing optical elements) for a typical laser is small, about 3 to 5. If the single pass line width through the resonator is denoted by $\Delta\lambda_1$, then an estimate of the final line width $\Delta\lambda_f$ after n passes is given by:

$$\Delta\lambda_f = \frac{\Delta\lambda_1}{\sqrt{n}} \tag{1}$$

Therefore, the single pass line width of the optical system is only about a factor of two higher than the final line width. Therefore, the efficiency of converting the broadband spectrum to line narrowed spectrum (i.e. from 300 pm to <1 pm) of the optical system must be very high.

Figure 5:
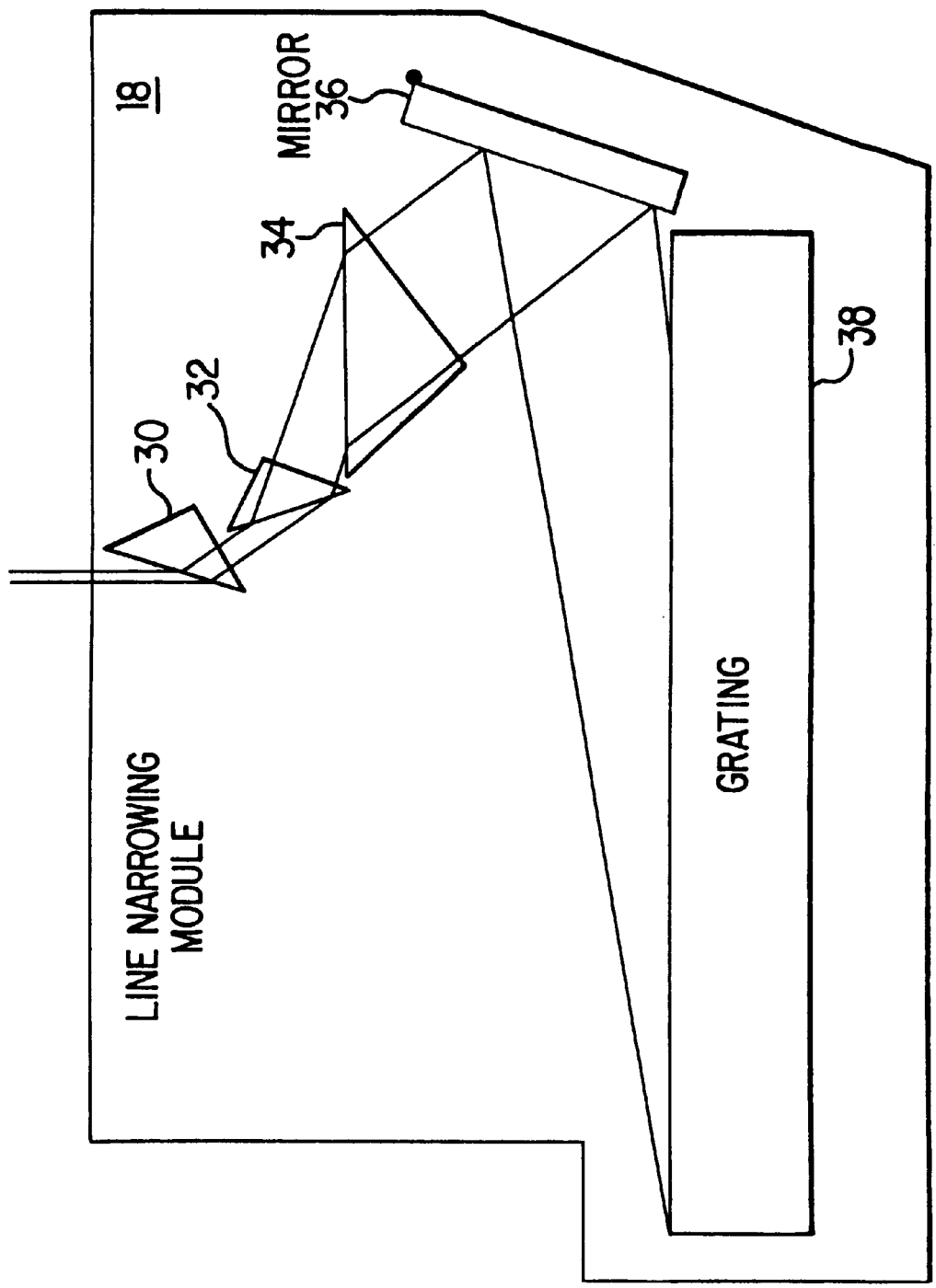
FIG. 5 shows a diffraction grating-based line-narrowing module.

The common technique of line-narrowing the KrF laser is by introducing wavelength dispersive optical elements in the resonator. Three types of dispersive elements can be used: prisms, etalons and gratings. The use of a high dispersive grating in a Littrow configuration has been the most effective spectral line narrowing technique. Because the grating is a dispersive element, to get a narrow line-width, the laser beam should have a small divergence where the beam illuminates the grating. Three prisms beam expanders 30, 32 and 34 as shown in FIG. 5 are inserted in the line narrowing module in order to expand the beam and thus reduce its divergence. Two apertures at both ends of the laser (not shown) are used to further reduce divergence.

The principal elements of a preferred line narrowing module are shown in FIG. 5. These include three prisms 30, 32 and 34, a tuning mirror 36, and an eschelle grating 38. The mirror is pivoted to select the wavelength of the laser. When this line-narrowing module 18 is used as the only line selecting module, the linewidth of KrF laser can be reduced to about 0.8 pm (FWHM) and 3.0 pm (95%).

Tunable Etalon as Output Coupler

Figure 4:
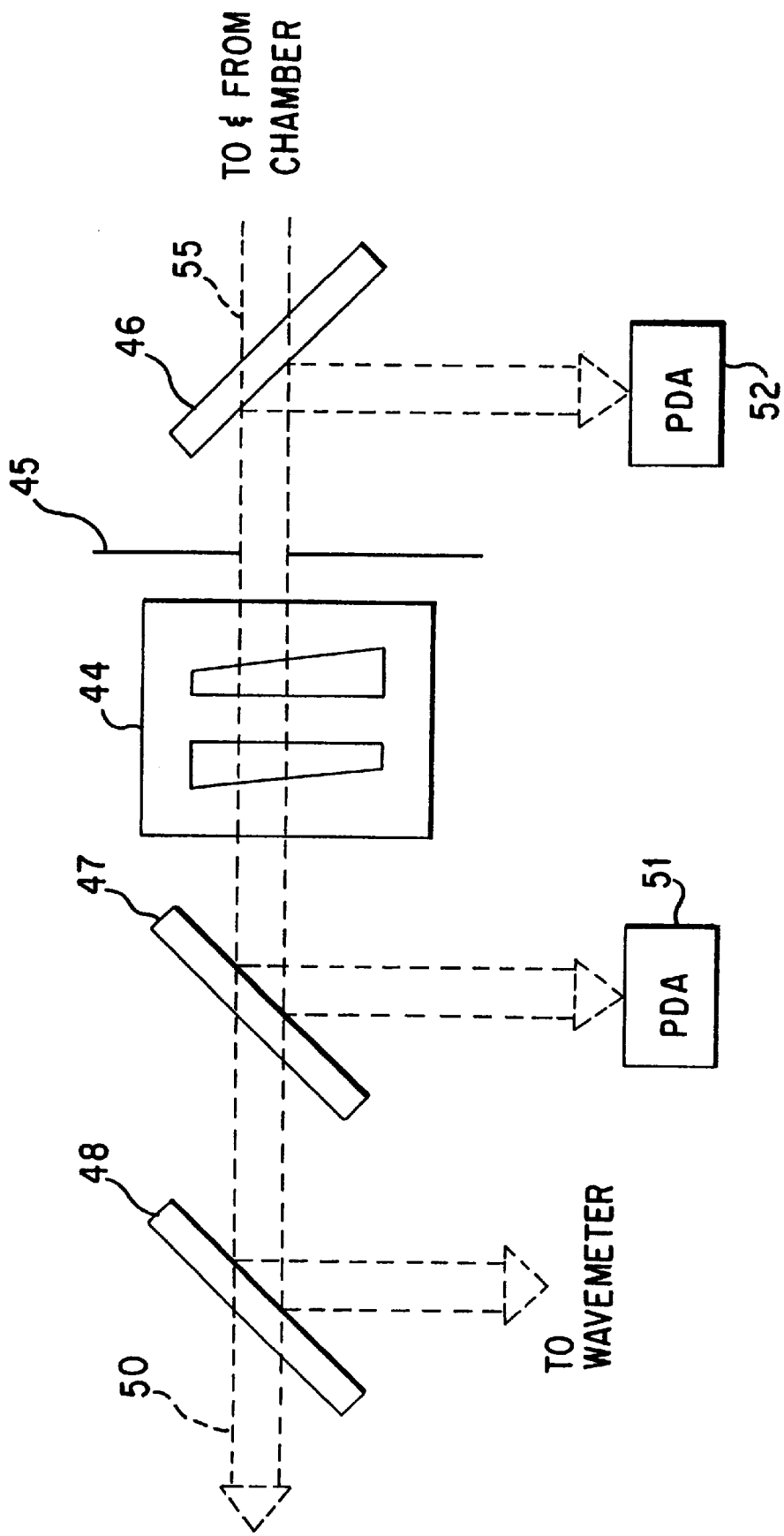
FIG. 4 shows some features of an etalon output coupler of a preferred embodiment of the present invention.

The use of the etalon output coupler 44 permits further reduction of the bandwidth of the laser. Etalon output coupler 44 as shown in FIG. 4 comprises two plates having two facing parallel surfaces separated by a distance, d. This space is filled with air, nitrogen, or other suitable gas.

Figure 2:
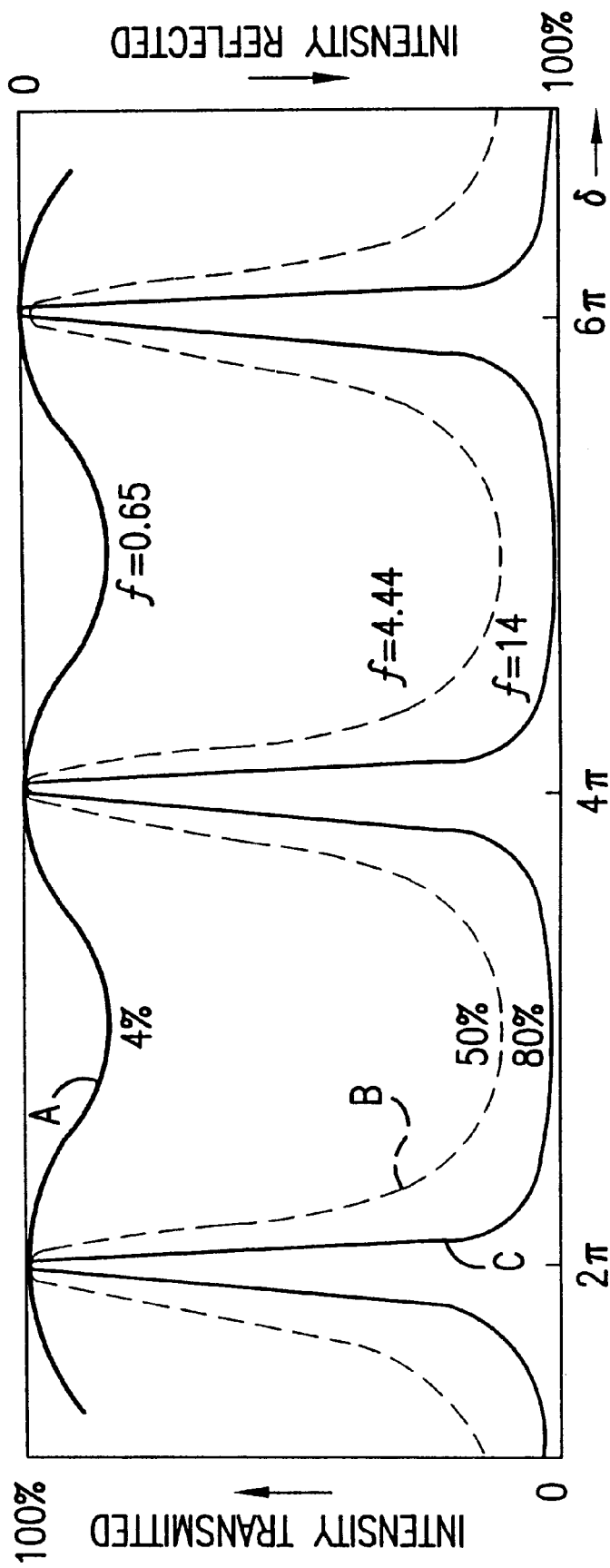
FIG. 2 shows the percent of light transmitted by an etalon as a function of the reflectance of the two inner etalon surfaces.
Figure 6:
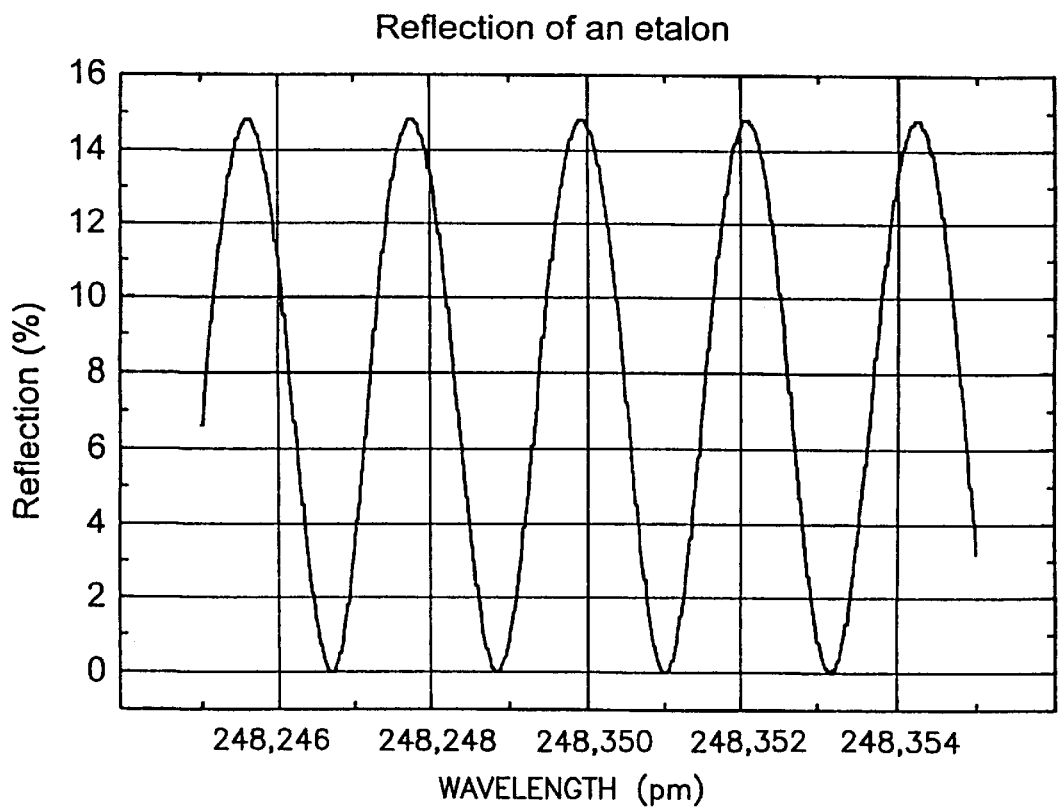
FIG. 6 shows a reflectivity of the etalon OC in dependence on wavelength.
Figure 7:
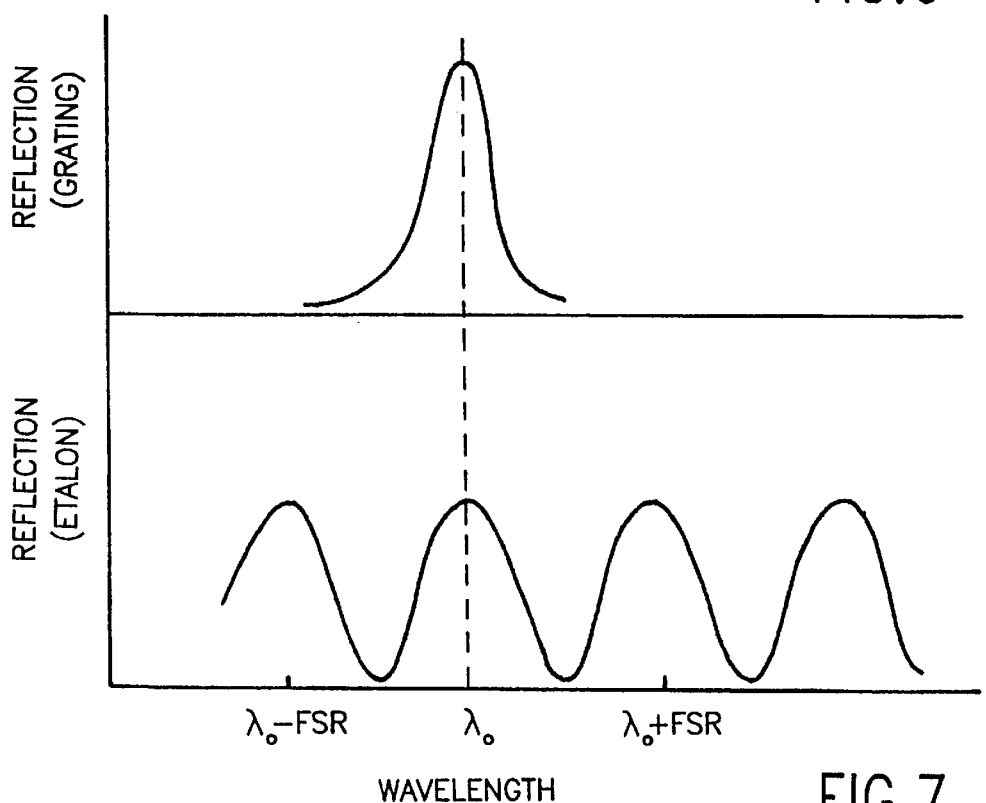
FIG. 7 shows relative positions of maximum reflectivity for line-narrowing module and etalon OC.

The preferred etalon output coupler has a reflectivity of the plates of about 4%. In this embodiment, the gas is nitrogen with an n of 1.0003. The gap size is about 15 mm and the wavelength is about 248 nm. In this case, the total reflectivity of the etalon is determined by an interference of the light waves, reflected from both parallel surfaces and is shown in FIG. 6 as a function of wavelength. For comparison, a curve A in FIG. 2 shows transmission of the same etalon. The minimum reflection is about 0% and the maximum is about 15%. If one of the reflection peaks is matched to the grating maximum, then about 15% of the light at the grating maximum is reflected back to the laser (85% is transmitted). Portions of the beam which are higher or lower in wavelength than the grating maximum by about 1 pm are not reflected at all. Higher reflectivity of etalon output coupler at one wavelength and its reduced reflectivity at other wavelengths, will cause the laser to preferably generate light at the wavelength of higher reflectivity. Therefore, the etalon output coupler works as a line narrowing device. Light which deviates from the grating maximum by about 2 pm would be reflected at about 15%. However, the grating is effective in controlling about 95% of the light to within about 1.5 pm of the grating maximum. Therefore, for the best line-narrowing, one of the maximums of the etalon reflection should be at the same wavelength as the maximum reflection of the grating in line narrowing module as shown in FIG. 7. In this case, the laser will generate at the central wavelength $\lambda_0$, and it will have the minimum line-width as wavelength selection effect of the etalon adds to the wavelength selection effects of the grating.

In order to implement the EOC technique, the position of one of the etalon peaks should be aligned with the position of the grating maximum reflection.

Position of etalon peaks is determined by:

$$\lambda_n = \frac{2nd}{N}, \quad (2)$$

where: N=is interference order, which can be any positive integer value $\lambda_n$=is the position of the peak corresponding to an etalon interference order, N, in the gap n=refractive index of the gas between the plates, and d=size of the gap.

For example, if n=1.0003 and d=15 mm, then an N=120,906 will give a peak at 248.201 nm, while N=120,760 will give a peak at 248.501 nm. Each increment of N, by one, will produce a new peak shifted by approximately 2 pm. Because there is a plurality of peaks separated by approximately 2 pm, there is always a peak available for taking any position of the grating.

As follows from equation (2), if we fix the value of N, the position of the peak corresponding to that N can be slightly changed by changing either n or d. This way, the etalon can be tuned, so that one of its peaks matches position of the grating. Both techniques for etalon tuning are known in the prior art. n value can be changed by changing pressure of the gas between the plates, as the refractive index n and gas pressure are related according to:

$$n=1.0+k \cdot p \quad (3)$$

where k is a coefficient depending on gas and wavelength. For Nitrogen, for example, $k=3.94 \cdot 10^{-10}$/Torr. So a pressure change of about 1 Torr will shift the peak by about 0.1 pm.

Another way to shift peaks is to change d using, for example, PZT adjusters which can precisely move one plate relatively to another. For example, a change in the gap of about 0.01 micron will shift the peak by about 0.165 pm.

When the laser wavelength needs to be changed, the mirror 36 is tuned at the different angle, thus moving the maximum of diffraction grating reflection to a different $\lambda_0'$. The etalon output coupler then needs to be tuned also, so that the new center wavelength $\lambda_0'$ coincides with one of the etalon maximums.

The reader should understand that this etalon is considerably different from the more conventional "transmissive" etalon. In the latter case, the reflectivity of the parallel plates is chosen between 20% and 99% of the light, and the line-narrowing is done for the transmitted light through the etalon. The multiple reflections (about 5 to 50) of the light between the parallel plates greatly increases the light intensity inside the etalon, thus causing a number of serious problems when high power laser operation is required. Such problems include, for example, thermal distortions of the beam, failure of the reflective coatings, etc. All these problems are insignificant in the etalon output coupler of the present invention because there is no multiple reflection of the light between the parallel plates. Instead, essentially single reflection from one plate interferes with a single reflection from the other plate. Moreover, the preferred reflectivity value of 4 percent can be achieved by using uncoated plates made of fused silica or $CaF_2$, using the Fresnel reflection from the etalon surfaces. This will reduce the probability of failure and increase the etalon output coupler lifetime even more.

ETALON DESIGN

Figure 11:
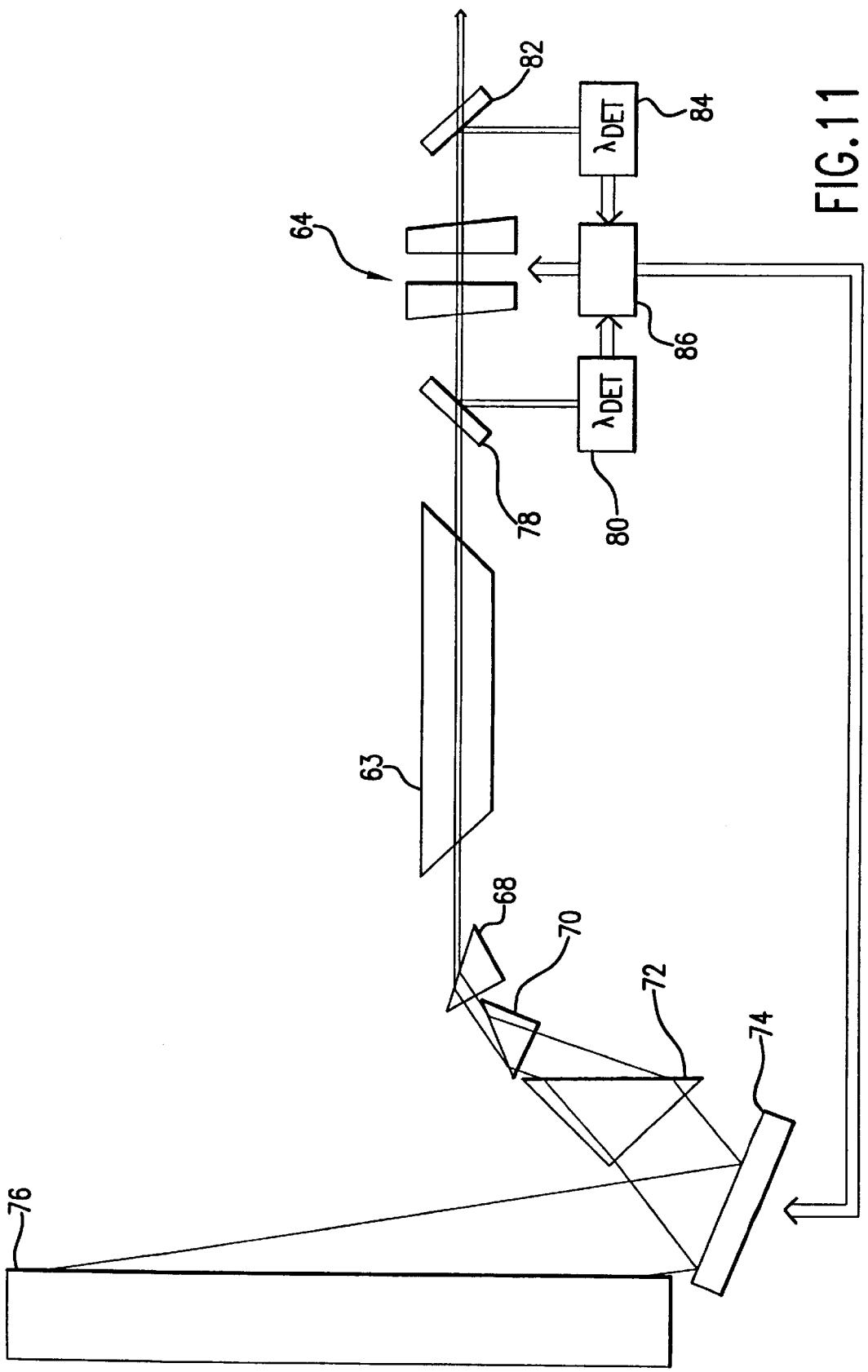
FIG. 11 is a drawing of a preferred embodiment of the present invention.
Figure 18:
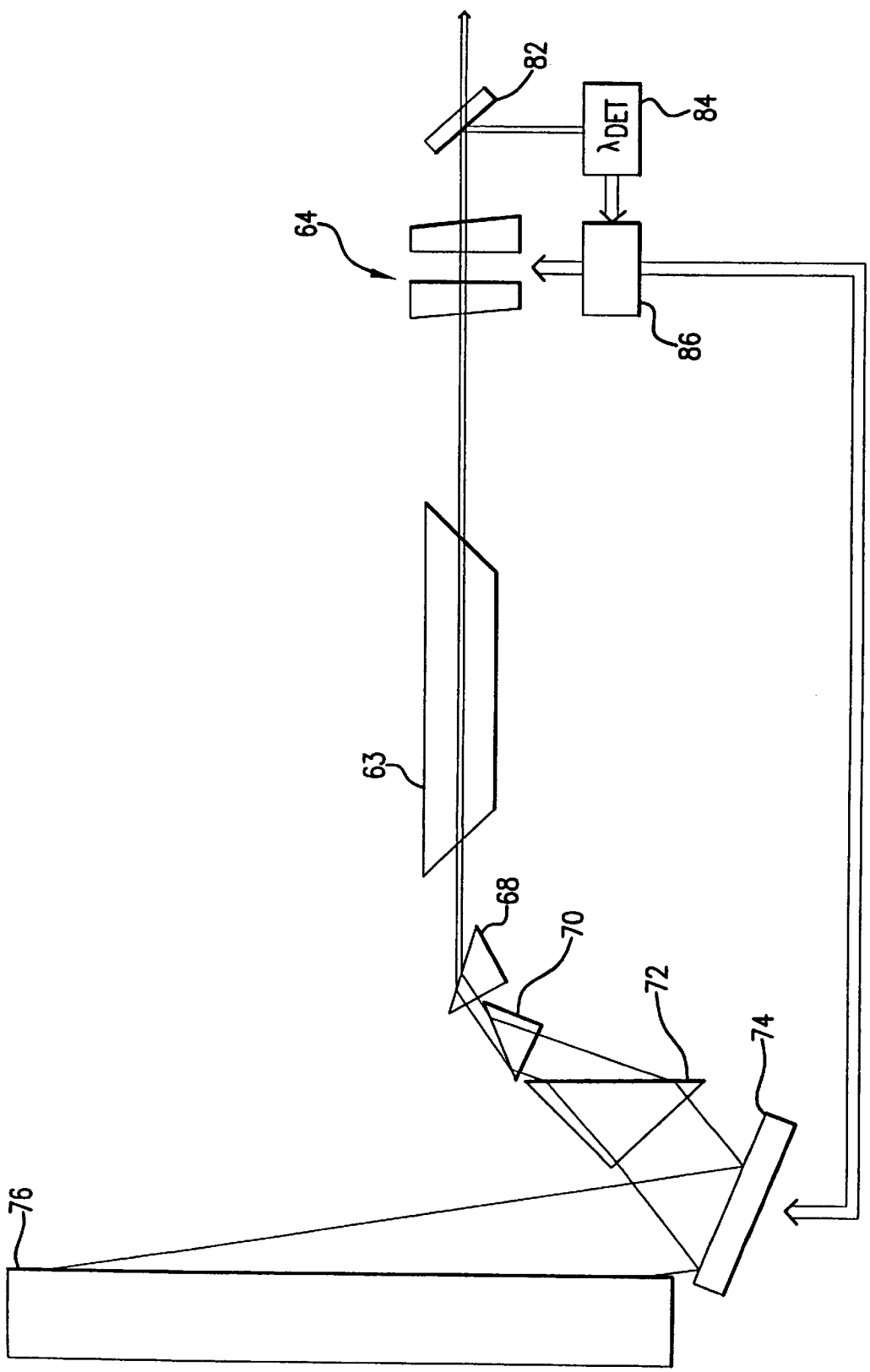
FIG. 18 is a drawing of an alternative preferred embodiment.
Figure 19:
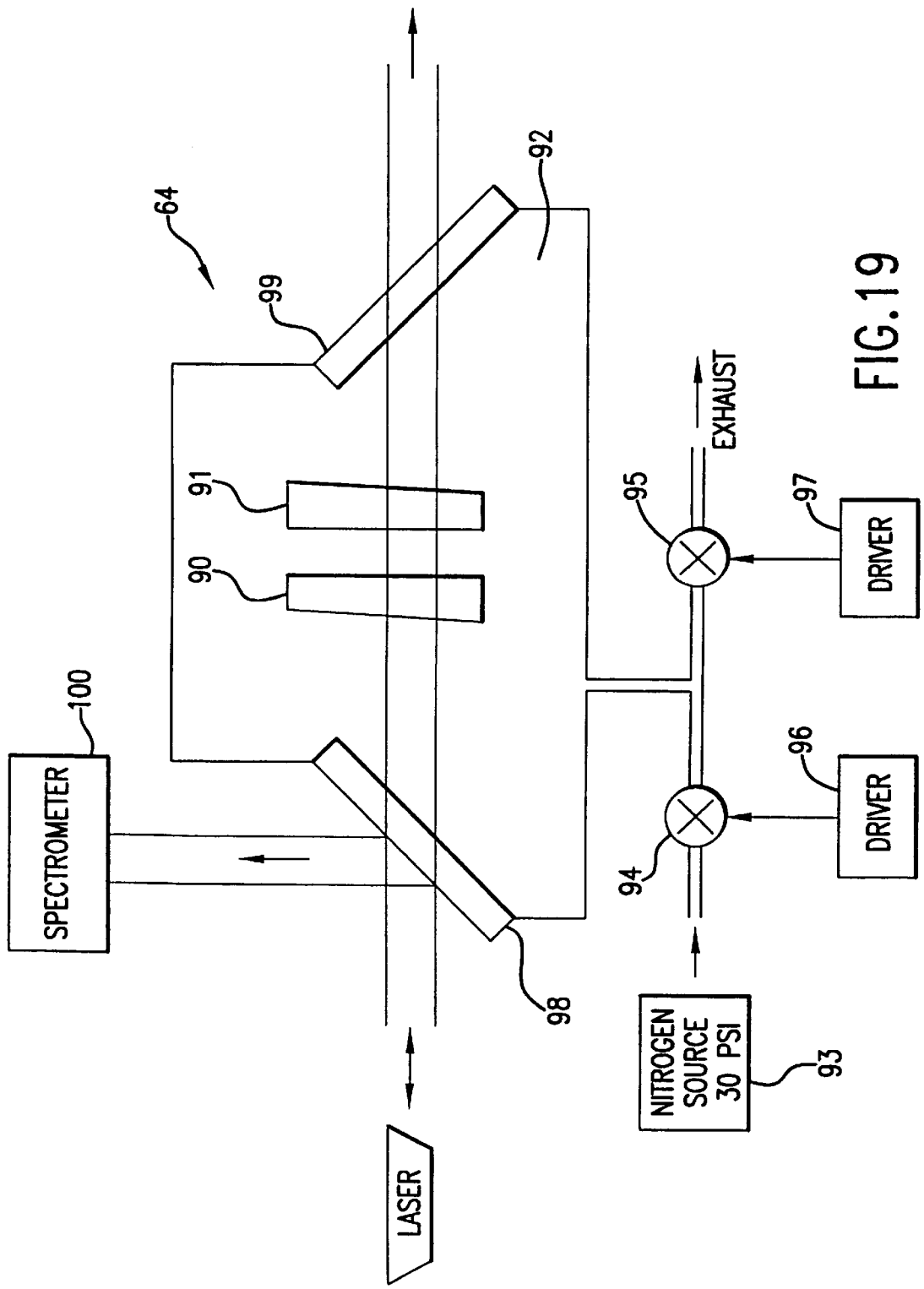
FIG. 19 is a sketch of a preferred tunable etalon output coupler.

FIG. 19 shows a preferred tunable etalon design. The etalon 64 comprises plates 90 and 91 separated by three fused silica spacers (not shown) optically contacted to the plates using well known prior art techniques. The etalon is tuned by increasing or decreasing nitrogen pressure in pressure chamber volume 92 using nitrogen from a 30 psi source 93, inlet valve 94 and outlet valve 95 controlled by electronic drivers 96 and 97 which are in turn controlled by processor 86 as shown in FIG. 11. Light from the laser enters through $CaF_2$ windows 98. Part of the beam is reflected back toward the laser as described above and most of the light is transmitted through $CaF_2$ window 99 as the output beam. About 2% of the light from the laser is reflected by mirror 98 to spectrometer 100 which analyzes the spectrum and reports the results to processor 86 (not shown). The reader should note that the etalon described here can be used in the other configurations shown in FIGS. 4, 11 and 18 with obvious minor modifications.

PREFERRED TECHNIQUES FOR ALIGNING THE ETALON FOR REQUIRED WAVELENGTH

First Preferred Alignment Technique

Figure 9A:
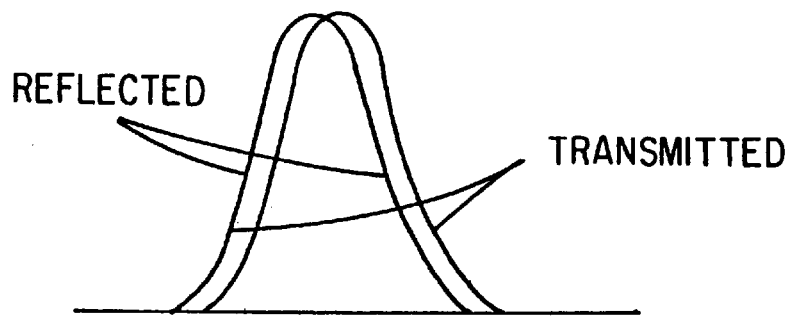
FIG. 9 shows the reflected and transmitted beams through an etalon output coupler.
Figure 9B:
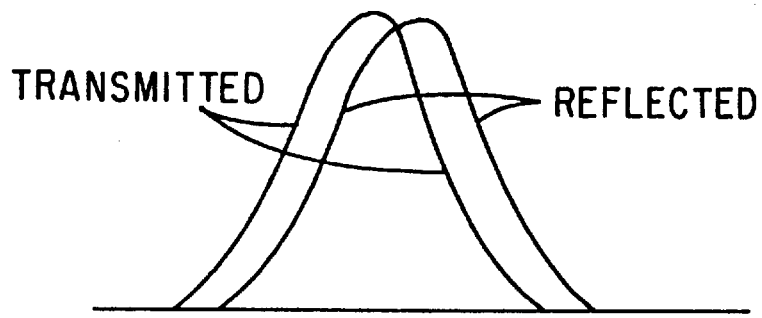
Figure 9C:
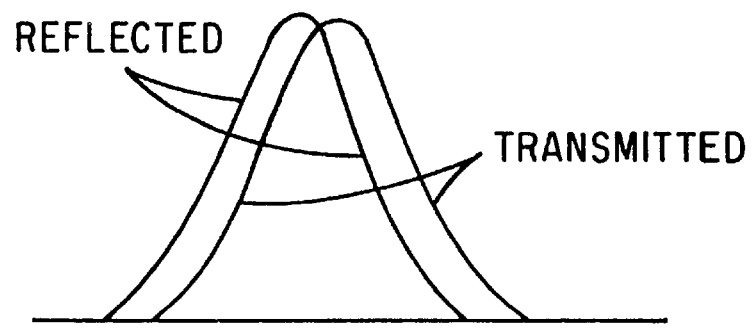
Figure 10:
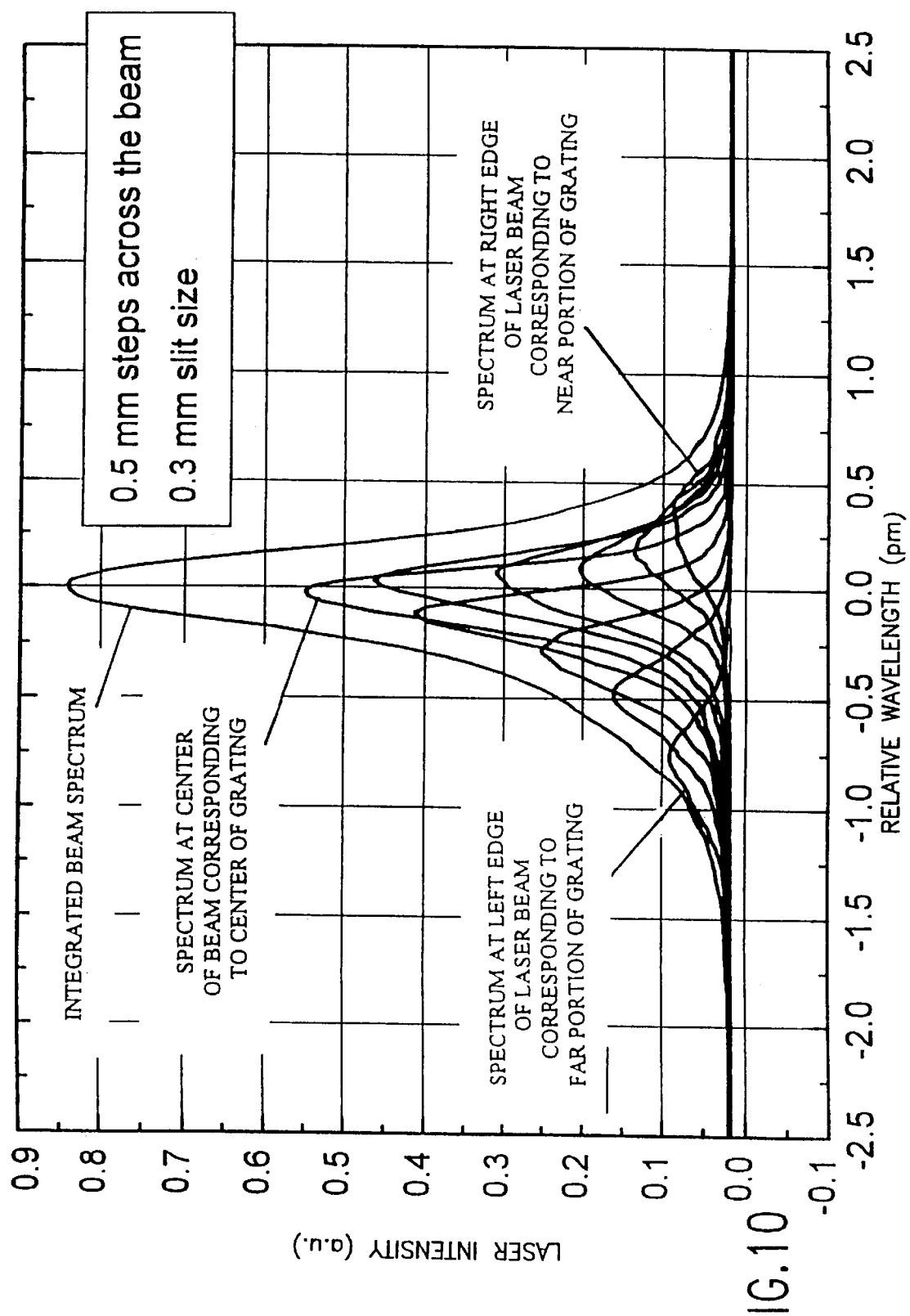
FIG. 10 shows the spatial distribution of the laser spectrum.

A first preferred technique for tuning etalon is shown by reference to FIGS. 4, 9A, 9B, 9C and 10. FIG. 10 shows the distribution of the laser spectrum across the output beam of laser 2 when line narrowed by line narrowing module 18. Each curve is a spectrum of the laser light when only small vertical slice of the beam is cut. One can see, that the spectrum of the left side of the beam is shifted towards shorter wavelengths, while the spectrum of the right side of the beam is shifted toward longer wavelengths.

FIG. 4 shows the elements of a preferred output coupler. The output coupler comprises etalon 44, aperture 45 and three partially reflecting mirrors 46, 47 and 48, each of them reflecting less than 1% of the light. The light 55 coming from the chamber goes through the partially reflecting mirror 46 and through the aperture 45. Aperture 45 determines the output size of the beam and in the preferred embodiment is about 3.5 mm×16 mm. Then the light hits the etalon output coupler 44. Spectrally line-narrowed light is reflected from the etalon back to the laser chamber for further amplification. Small portion of that light is reflected by partial reflector 46 and directed to photo-diode array 52. The photodiode array is positioned to measure the horizontal beam profile. Here and everywhere in this patent we assume the vertical plane is the plane passing through both the cathode and the anode of the laser, and the horizontal plane is perpendicular to it.

The rest of the light goes through the etalon and is shown as 50. Small portion of that light is reflected by partial reflectors 47 and 48. Partially reflected mirror 47 reflects less than 1% of the light to the photo diode array 51. This array 51 measures the horizontal beam profile of the transmitted light. The information on transmitted and reflected beam profiles is transmitted from arrays 51 and 52 to the computer controller 22 (FIG. 3A). This controller measures relative position of reflected and transmitted profiles. FIG. 9 shows three different situations. FIG. 9A is when the etalon is tuned to the same wavelength $\lambda$ as the grating. FIGS. 9B and 9C show the situation when there is a small misalignment between the etalon and diffraction grating. One can see that small misalignment causes shift of the reflected beam profile relative to transmitted beam profile. In FIG. 9 the shift of reflected light to the right is when the maximum of the etalon is at a slightly longer wavelength then the maximum of the grating. The shift of reflected light to the left is when the maximum of the etalon is at a slightly shorter wavelength.

These beam profiles are analyzed by a computer controller 22, and the error correction signal is generated. In the situation of FIG. 9B, it generates the correction signal to reduce the optical length between the plates of the etalon, and in the situation of FIG. 9C it generates the correction signal to increase the optical length. The author of the present invention used a pressure tuned etalon with a space between the plates of about 15 mm to spectrally line-narrow the KrF excimer laser. The detection technique of the present invention was capable of detecting the misalignment of the grating and the etalon to better than 0.1 pm which satisfies the requirements for micro-lithography. The minimum pressure adjustment used was about 0.5 Torr, which shifts the etalon to about 0.05 pm. Very stable operation of the laser with a bandwidth of less than 0.4 pm (FWHM) and 1.0 pm (95% integral) was achieved. The position of the laser center wavelength was controlled by using a wavemeter 20 which measures the absolute wavelength of the emitted light and this value is used by computer controller 22 to position the reflecting mirror 36 in the line-narrowing module (FIG. 5). Thus the tuning of the laser was done in a "master-slave" mode, where the master control of the central wavelength was done by a mirror 36 (FIG. 5), and the 'slave' control of the etalon was done based on optimizing beam profiles of reflected and transmitted beams.

When such a beam as is shown in FIG. 10 hits the etalon, the left and right portions of the beam will be reflected depending on the tuning of the etalon. If the etalon is tuned correctly, then the maximum reflectivity will be for the central part of the beam, which has a wavelength close to central wavelength $\lambda$ of the laser. The left and right parts of the beam will have their wavelengths detuned slightly from the center, so they will have somewhat smaller reflection from the etalon. That reduction of the reflection is about the same for both left and right sides of the beam, so there is no overall shift of the reflected beam profile. On the other side, when the etalon detuned slightly, the center part of the beam would have small detuning from the maximum position of the etalon. One side (for example, left) would have even larger detuning, but the other side (right) would be right at the etalon maximum position. Therefore, the right side would have the maximum reflection, the center would have smaller reflection, and the left side would have the smallest reflection. This will effectively shift the reflected beam profile to the right.

On the other hand, the shift in the output beam of the laser is rather small as it was experimentally observed. This can be understood, if one remembers, that in transmitted light, the relative difference between the maximum and the minimum is very small, as the maximum is 100%, and the minimum is 85%, while in reflected light the relative difference is much larger, as the maximum is 15%, but the minimum is 0%.

Second Preferred Alignment Technique

Figure 8:
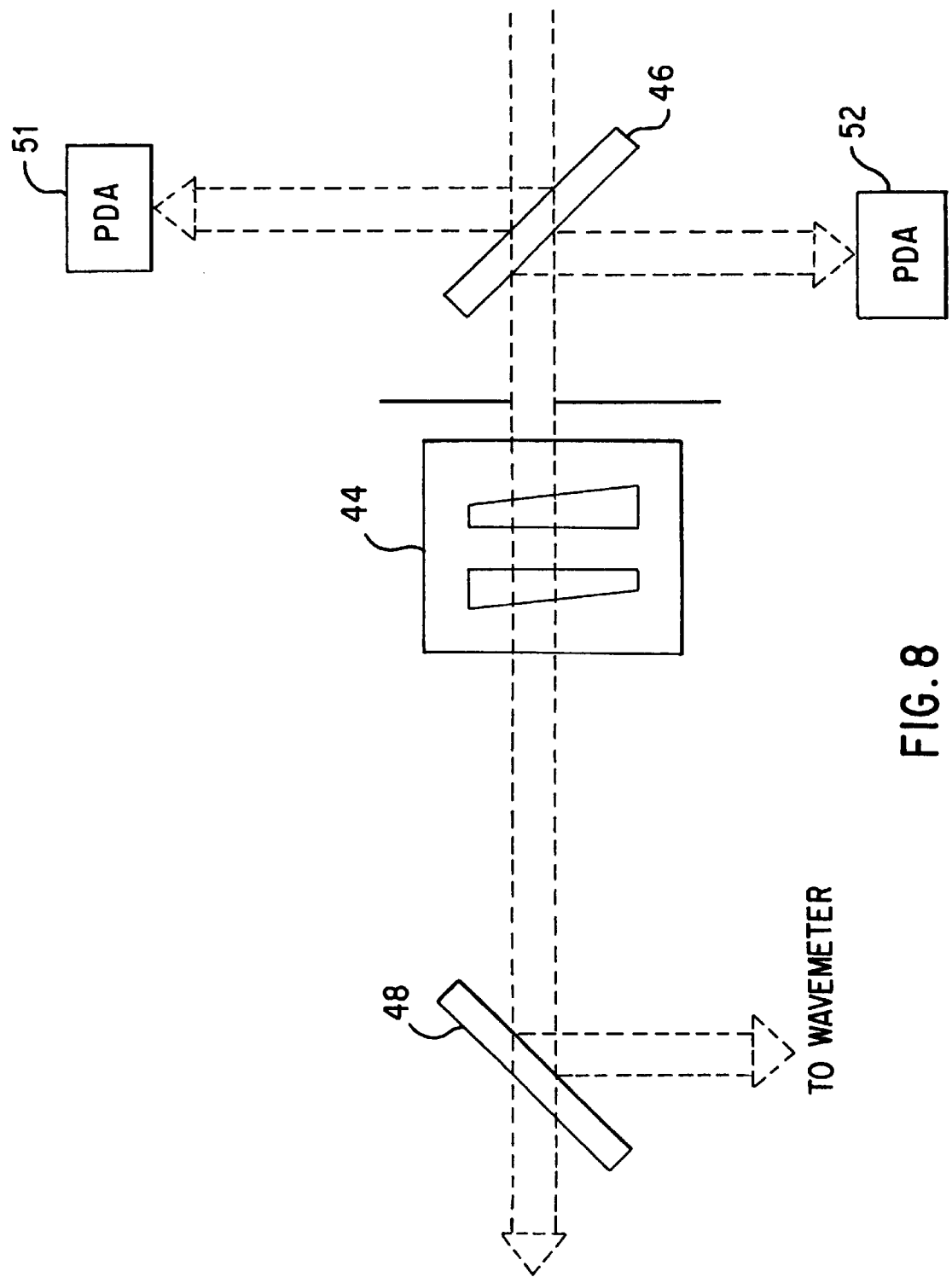
FIG. 8 shows the second preferred embodiment of the present invention.

FIG. 8 shows a second preferred embodiment of the present invention. In this embodiment, a single partially reflecting mirror 46 is used to collect a small portion of the incident light on the etalon as well as reflected spectrally line-narrowed light. In this embodiment, the beam profiles of the incident and reflected beams are compared rather than transmitted and reflected beams. The rest of the technique is similar to the first preferred embodiment.

Third Preferred Alignment Technique

In a third technique shown in FIG. 11, the laser spectrum rather than the beam profile is analyzed to derive information on misalignment. First, the laser beam spectrum is analyzed to first look for two separate peaks in the light reflected back toward the chamber from the etalon output coupler 64. Two peaks (a large one and a small one) would result from gross misalignment of the output coupler and the line narrowing module. If there is only one peak, this means that any misalignment is only minor. In this case, the spectrum is analyzed to look for a distortion which would result from a small misalignment. If misaligned, the output coupler is tuned to match the wavelength selected by the grating. This is preferably done by increasing the gas pressure between the etalon plates or by changing the spacing between the two etalon plates.

Figure 1:
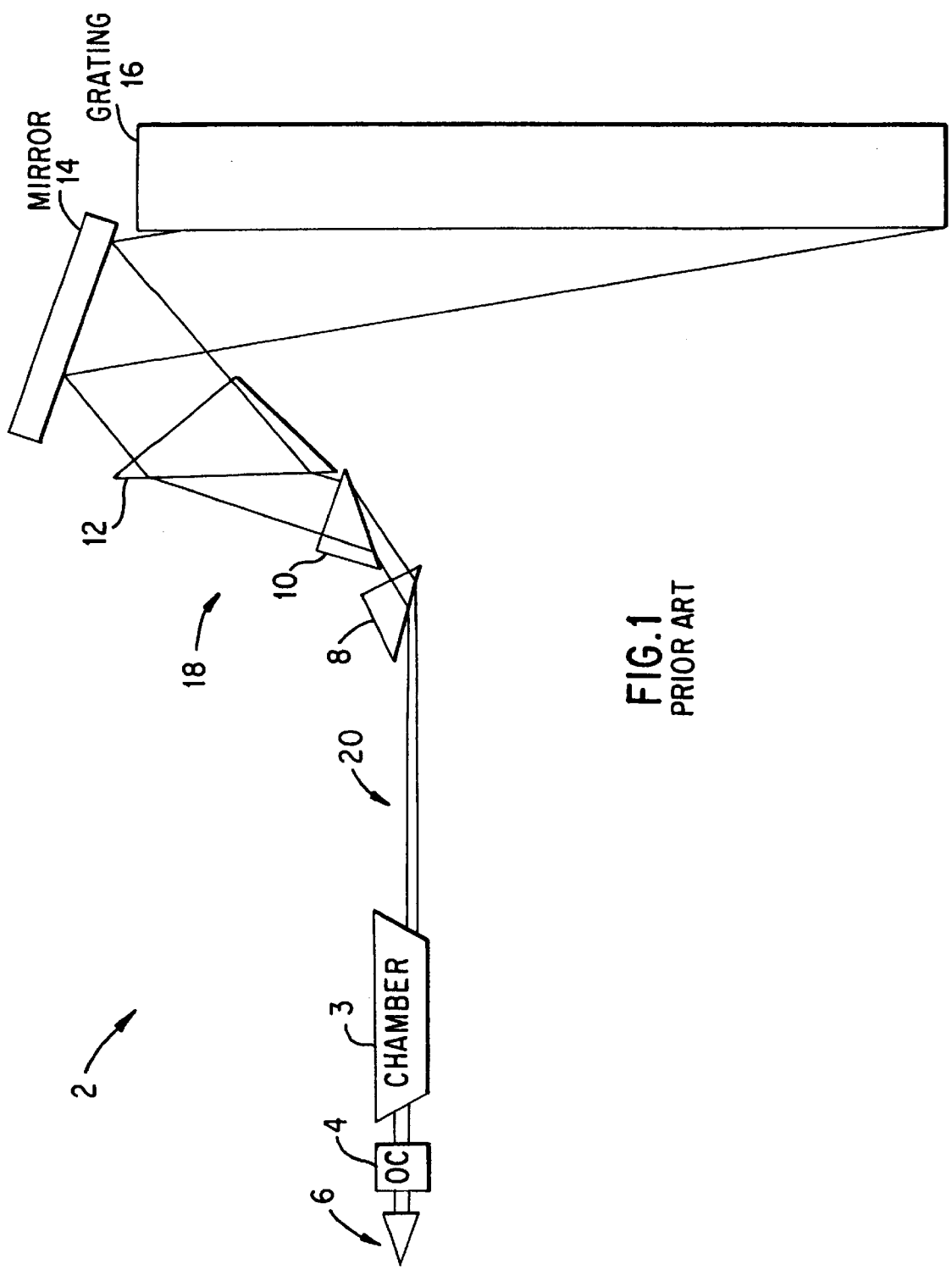
FIG. 1 shows a prior art line-narrowed laser.
Figure 12A:
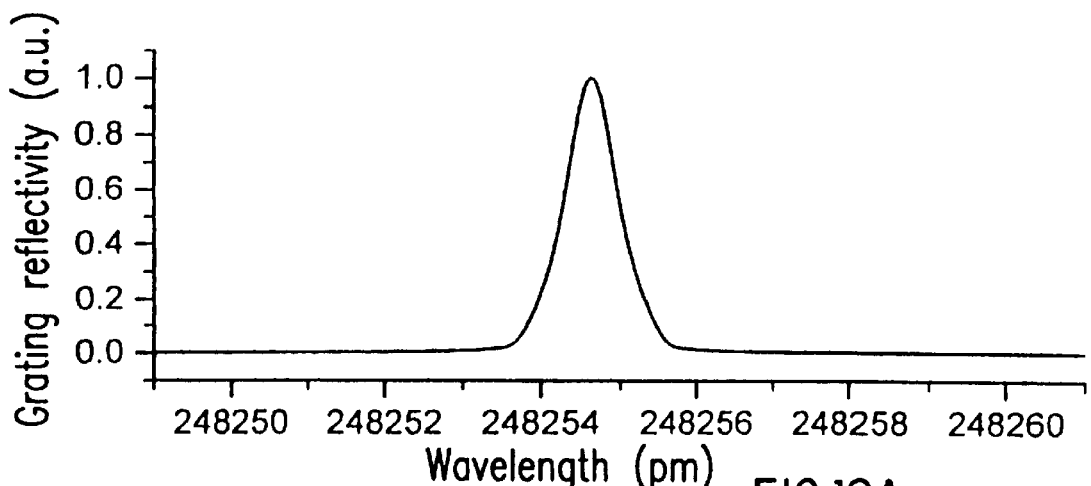
FIGS. 12A, B and C demonstrate a gross misalignment.
Figure 12B:
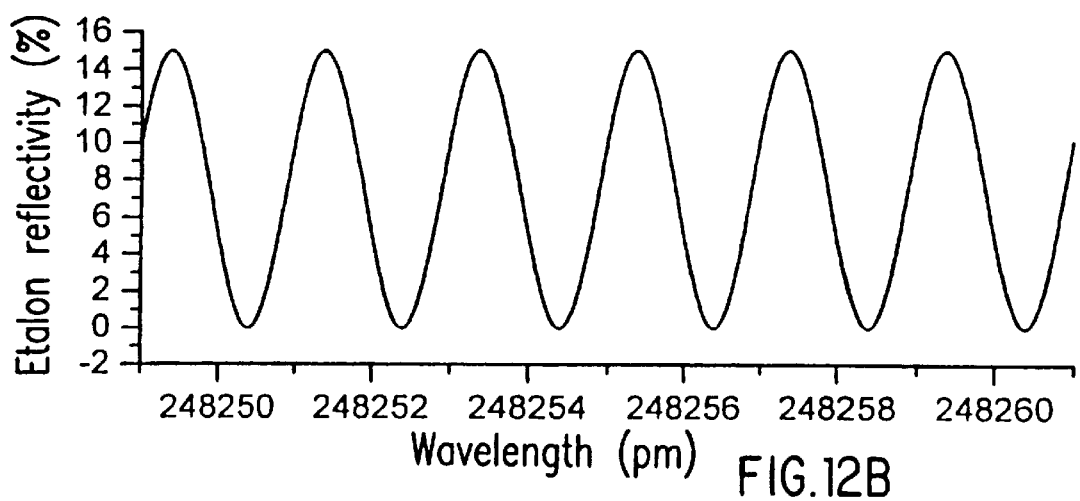
Figure 12C:
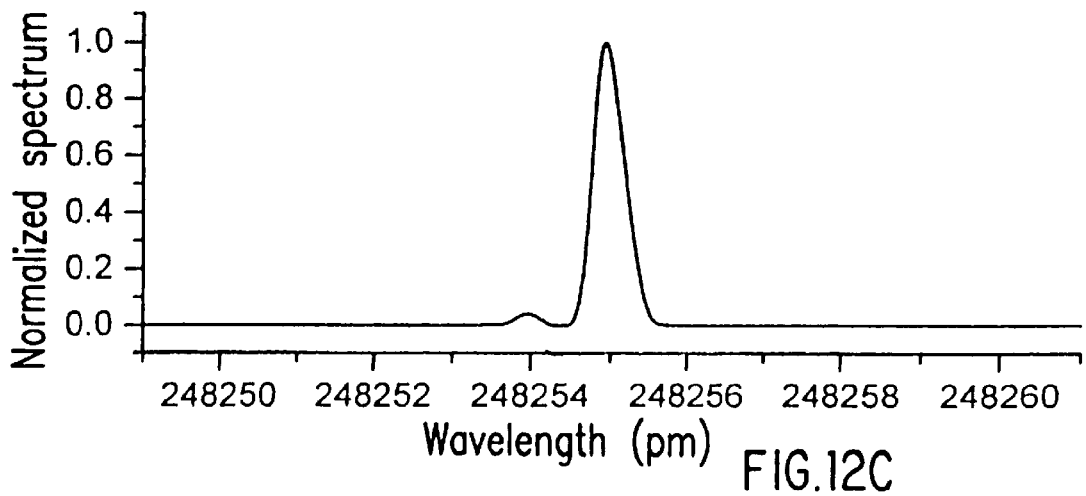
Figure 13A:
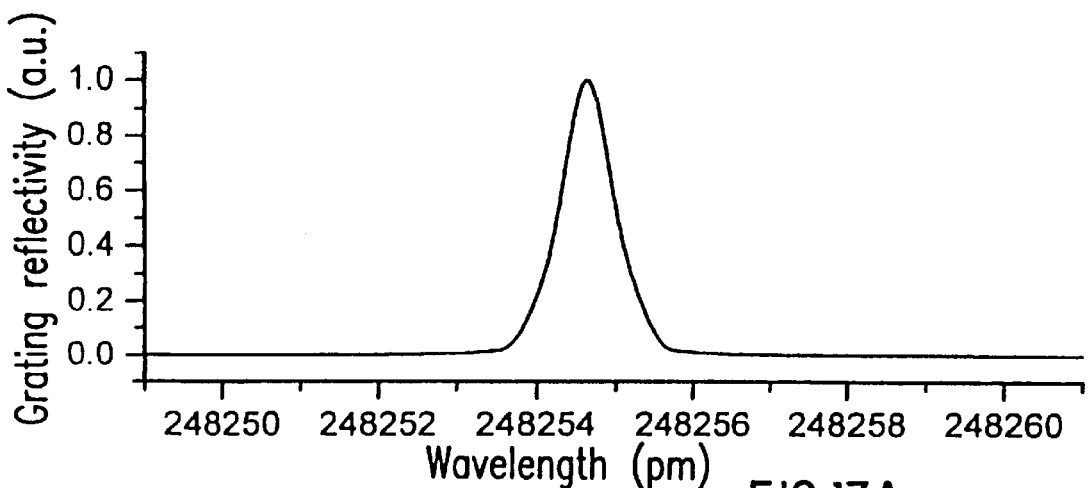
FIGS. 13A, B and C demonstrate a gross misalignment.
Figure 13B:
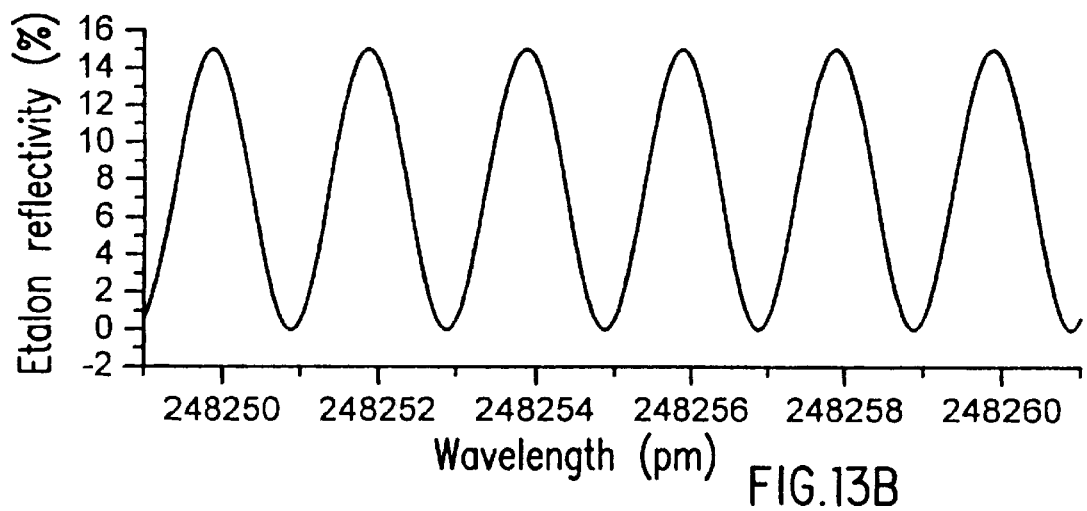
Figure 13C:
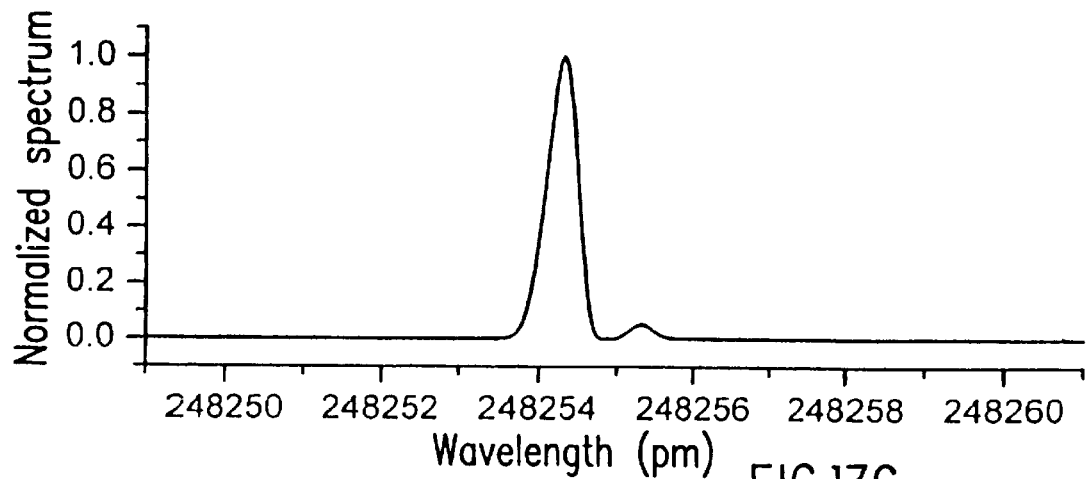

As shown in FIG. 1, the laser is first approximately tuned to a desired wavelength using a prior art wavemeter 84 as described in U.S. Pat. Nos. 5,025,445 or 5,420,877 to tune the grating based line narrowing module with tuning mirror 74. At the output side of the laser a small portion (such as about 2 percent) of the light reflected by etalon 64 is directed by beam splitter 78 to spectrometer 80 which measures the spectrum of this reflected light. Spectrometer 80 could be any prior art spectrometer capable of spectral measurement in the 248 nm range with accuracies in the range of 0.1 pm or better. Such spectrometers are described in detail in U.S. Pat. Nos. 5,025,445 or 5,420,877 which are incorporated herein by reference. In the process of tuning the etalon output coupler 64 to the grating based line narrowing module, there are two possible cases: the etalon is grossly misaligned, and the etalon is slightly misaligned. Lets consider the case of gross misalignment first. In this case, the position of the closest maximum of the etalon is shifted from the position of diffraction grating maximum by a value, comparable with the width of the maximum itself. It should be pointed out, that because there are a multitude of the etalon maximum peaks, the maximum misalignment of the etalon cannot be more than half of the etalon free spectral range. In the preferred embodiment of ultra-narrow KrF excimer laser the etalon FSR is about 2 pm. Therefore, the maximum misalignment of the etalon is about 1 pm. FIG. 12A shows a position of grating maximum, and positions of the etalon maximums are depicted in FIG. 12B for a large misalignment, where the closest etalon maximum is shifted by 0.75 pm in the direction of longer wavelengths relative to the grating maximum. FIG. 12C shows the generated laser spectrum in this situation as would be measured by spectrometer 80. This spectrum is a result of convolution of the etalon reflection curve and grating reflection curve, with this convolution taken to the power equal to the average number of round trips of the light in the cavity, which is about 2. The spectrum has a stronger peak and a weaker peak. The stronger peak is shifted towards longer wavelength values than the smaller peak. The spacing between the peaks is about 1 to 1.5 pm. FIGS. 13A, B and C show the situation where closest etalon maximum is shifted by 0.75 pm towards the shorter wavelengths relative to the grating maximum. This situation is symmetrical to the one shown in FIG. 12C, but now the larger peak is shifted towards the shorter wavelength values as compared to smaller peak.

Therefore, if a double peak is detected, the appropriate correction will depend on the relative position of the larger and smaller peaks. If the larger peak is shifted to the longer wavelength values, the etalon output coupler's FSR should be reduced, otherwise, it should be increased.

The largest ratio of the magnitude of larger and smaller peaks, which can still be identified as a double peak structure is determined by the noise level in the system. In the experiments, done by the author, the minimum amplitude of the smaller peak, which could still be reliably identified as a double peak structure was set at about 5% relative to the maximum amplitude of the peak.

Figure 14A:
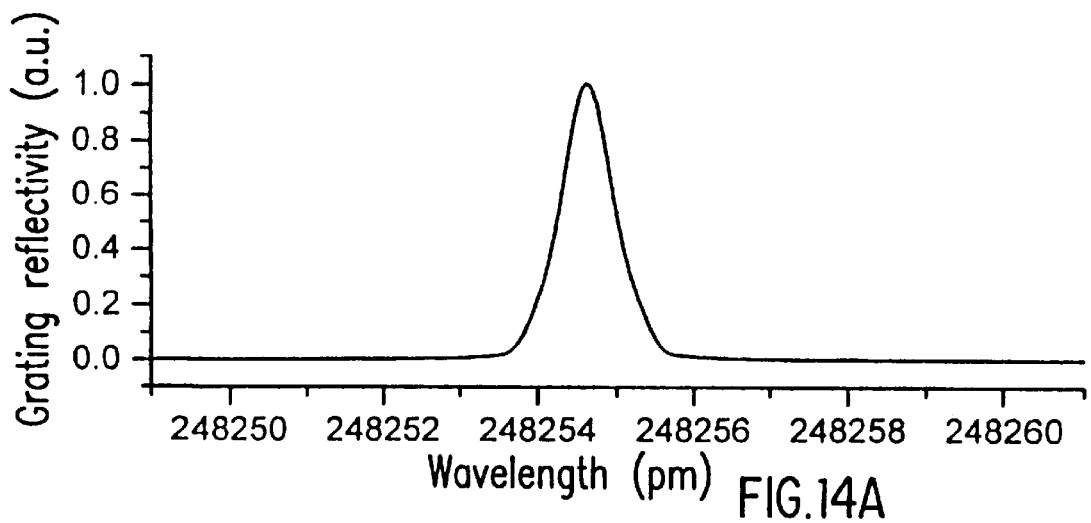
FIGS. 14A, B and C demonstrate a small misalignment.
Figure 14B:
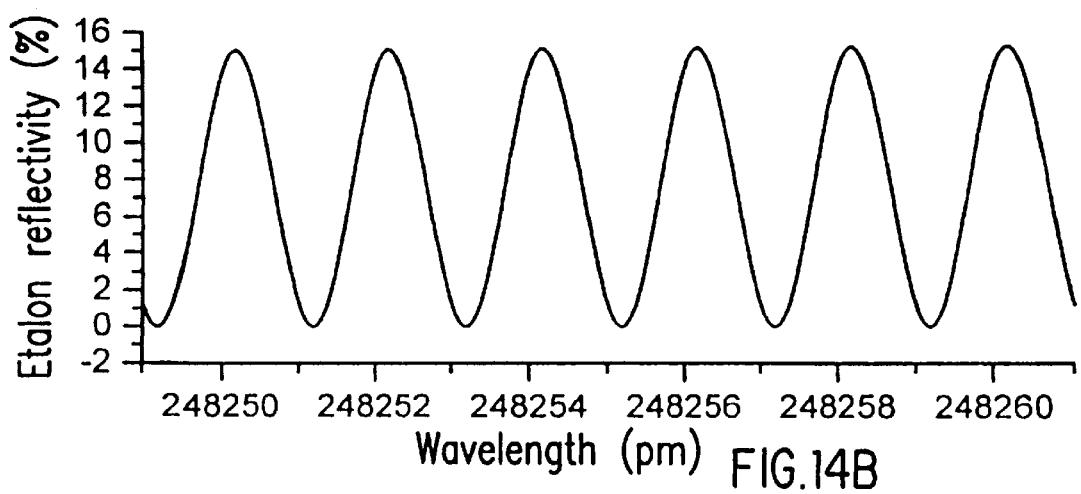
Figure 14C:
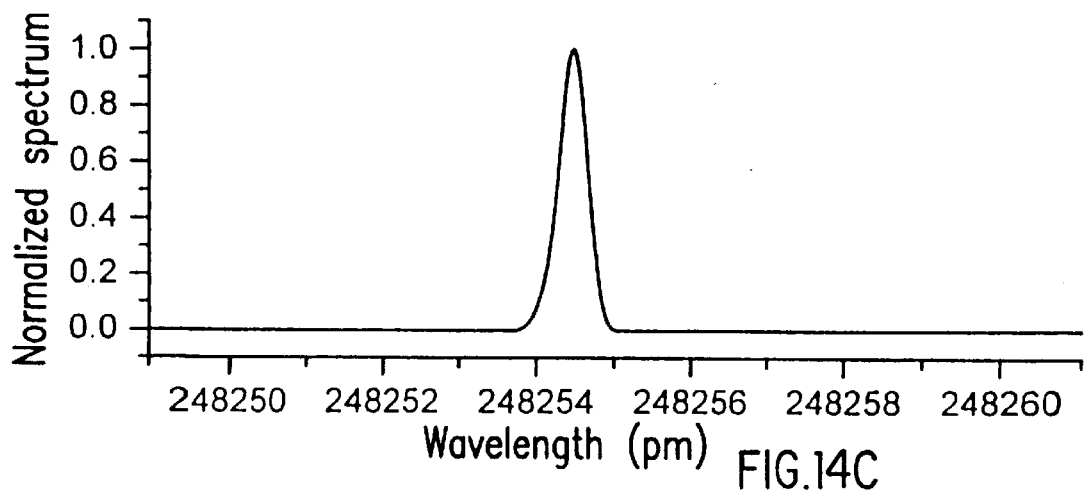
Figure 15A:
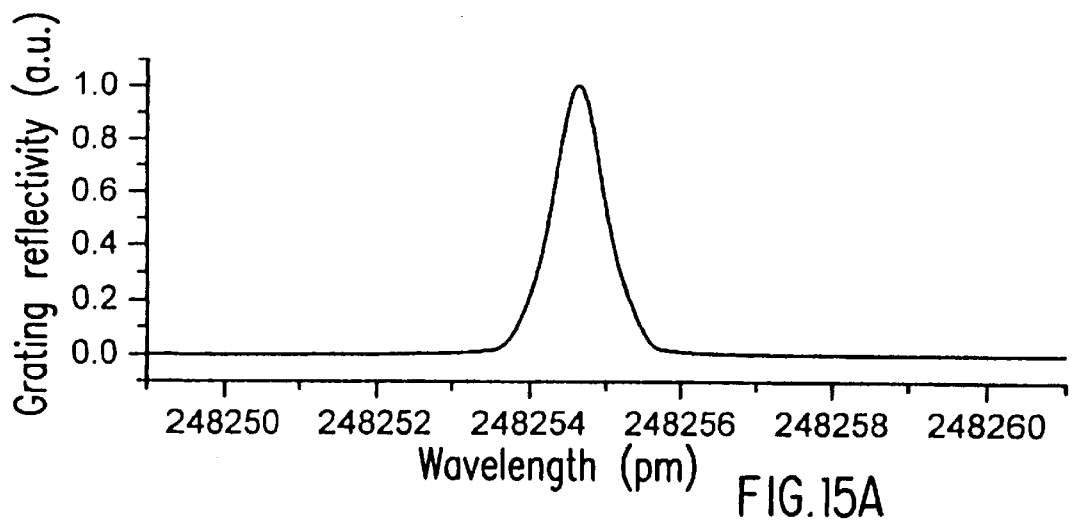
FIGS. 15A, B and C demonstrate a small misalignment.
Figure 15B:
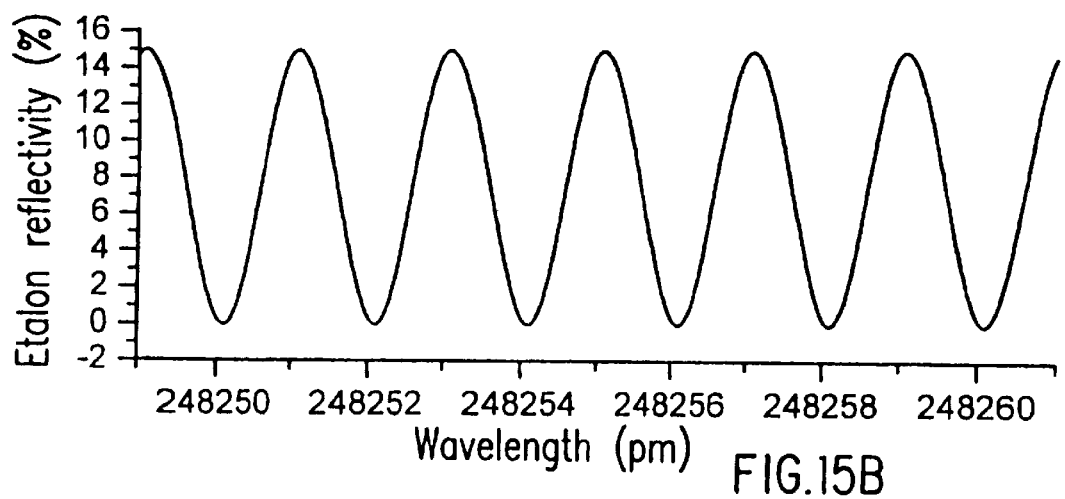
Figure 15C:
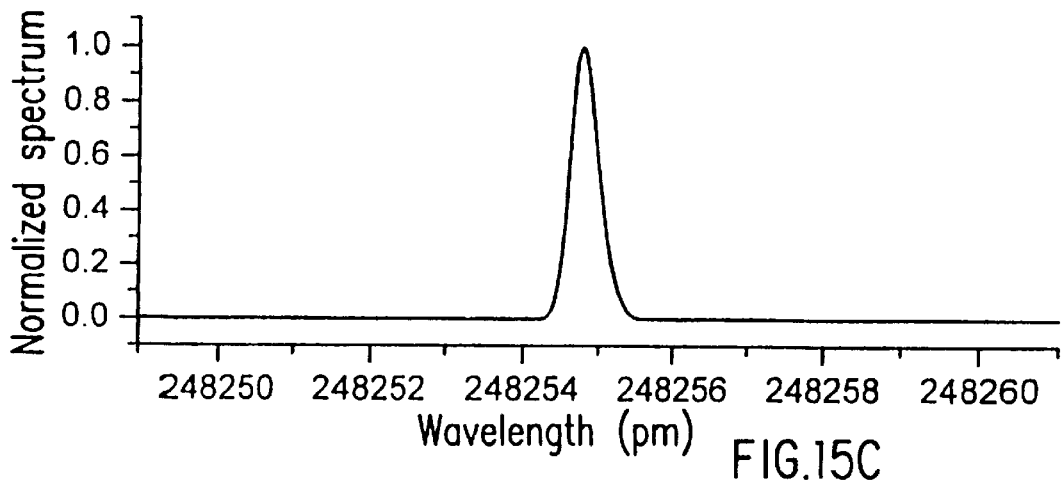

As controller 42 corrects the gross misalignment of etalon and diffraction grating, the smaller peaks get smaller and smaller, and at some point it is no longer detectable. This situation is shown in FIGS. 14A, B and C and FIGS. 15A, B and C. FIGS. 14A, B and C show the case, when the closest etalon maximum is shifted to the shorter wavelengths by about 0.45 pm relative to the grating maximum. FIG. 14C shows the laser spectrum in this situation. The spectrum does not have second bumps, but does have an asymmetry in it, with the extended tail going into the shorter wavelength region. FIG. 15C shows the case when the OC maximum is shifted towards longer wavelength relative to the grating maximum by about 0.45 pm. This produces an asymmetric spectrum with an extended tail into the longer wavelength region.

Figure 16:
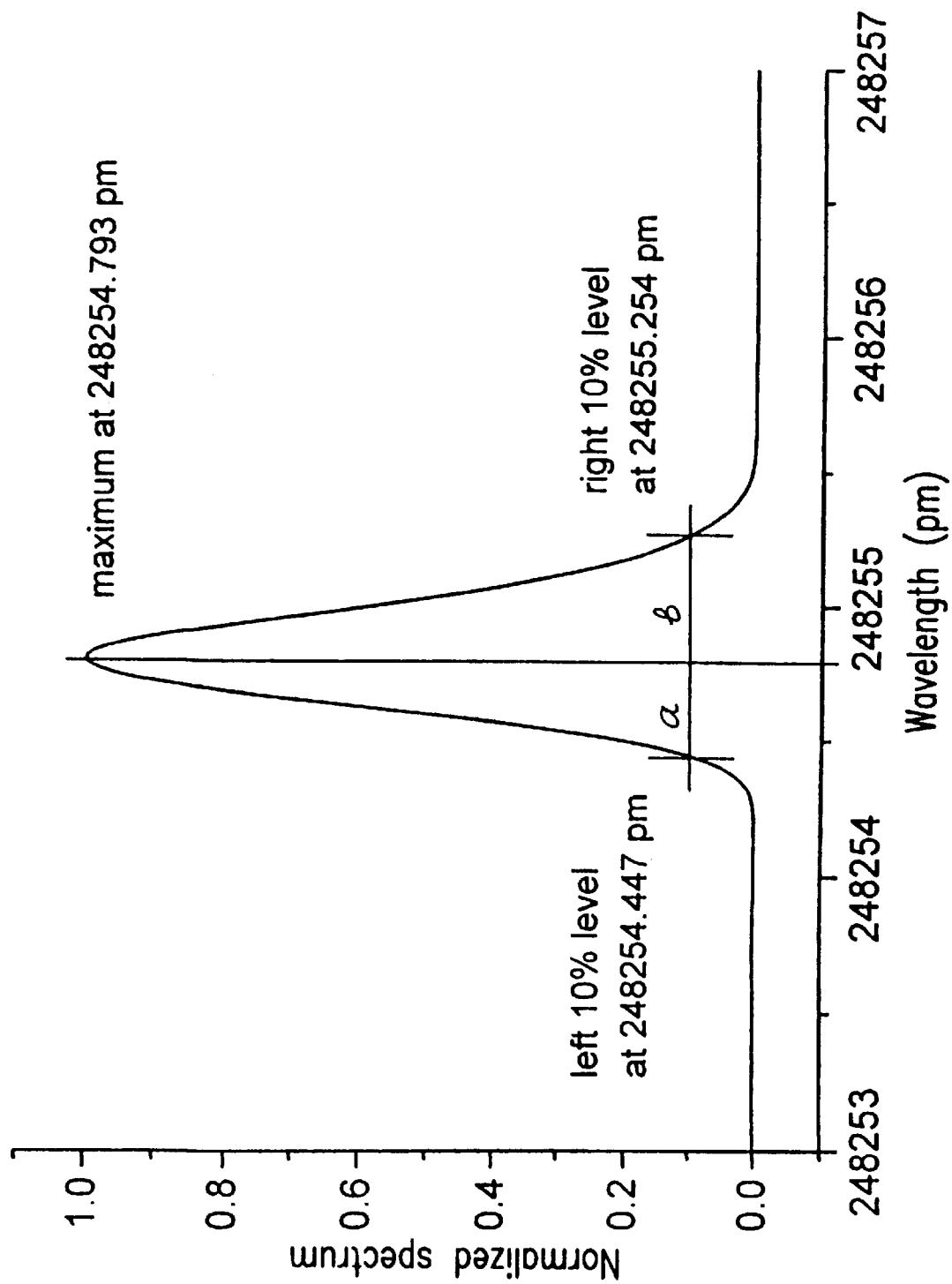
FIG. 16 demonstrates a method of detecting a slight misalignment.

This asymmetry of the spectrum is analyzed by controller 42 and used to generate the etalon correction signal. If asymmetry extends towards longer wavelengths, like in FIG. 15C, the FSR of the etalon output coupler should be reduced. If, on opposite, the extends towards the shorter wavelengths, the FSR of the etalon output coupler should be increased. This would provide a very accurate control of the etalon tuning, allowing the peak of the etalon to be tuned to within about 0.1 pm or better relative to the peak of diffraction grating. There are many ways known in the prior art to analyze the asymmetry of the spectrum. In the preferred embodiment, the assymetry is determined at 10% level as shown in FIG. 16. In this technique, three values are used: position of the maximum, and positions at 10% level on both sides from the maximum. Then the distances a and b are calculated, where a is the distance between the maximum to the 10% level position on the shorter wavelength side of the spectrum, and b is the distance between the maximum and the 10% level position on the longer wavelength side of the spectrum. The asymmetry h of the spectrum is then calculated as $$h = (b-a)/(b+a)$$

Figure 17:
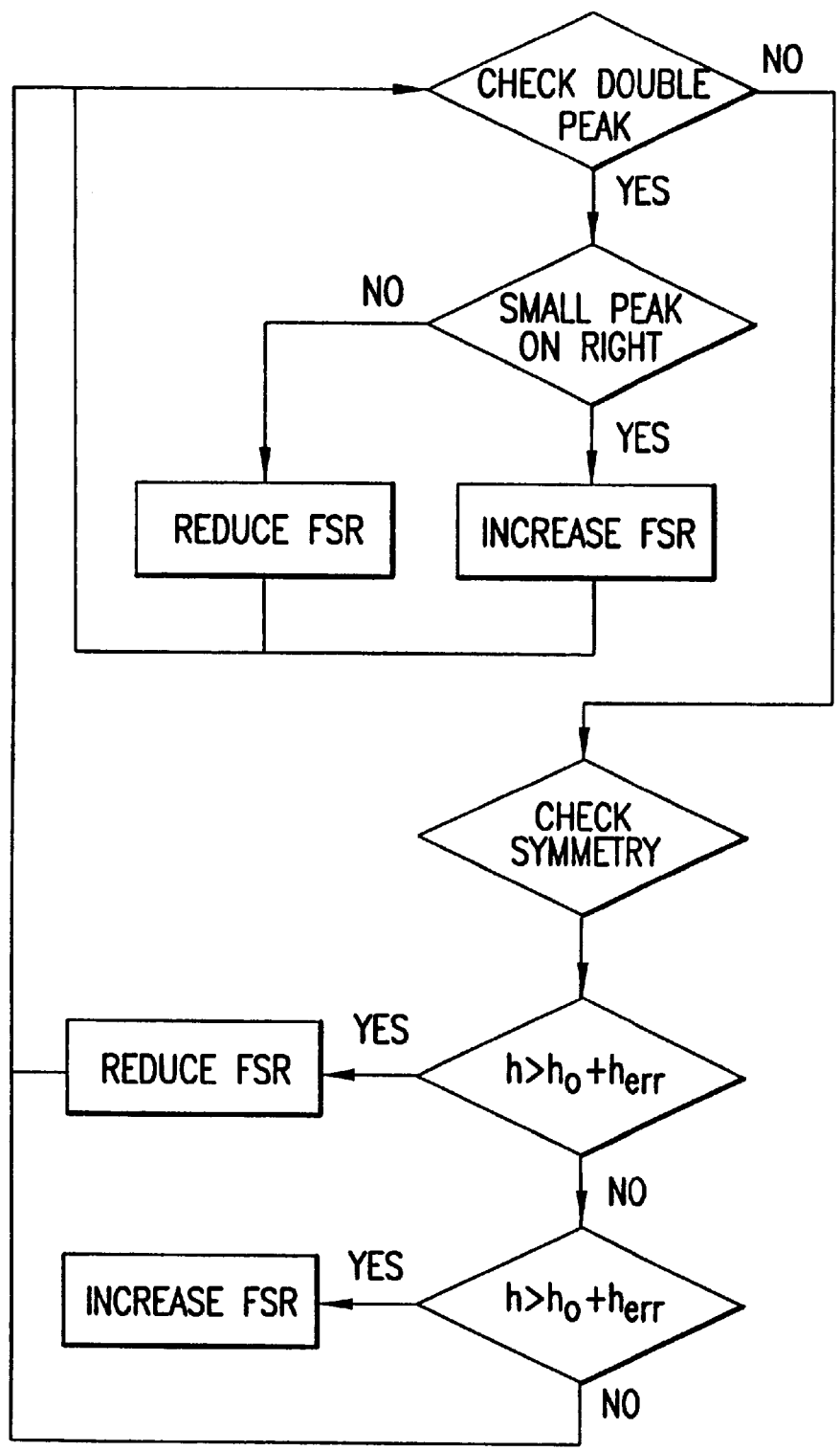
FIG. 17 is a flow chart showing how to correct a misalignment.

The value of asymmetry h is used by controller 42 to control FSR of EOC. This value is compared with the target value $h_0$ and allowable error $h_{err}$. If $h < h_0 - h_{err}$, than FSR should be increased, if $h > h_0 + h_{err}$, then FSR should be reduced. Otherwise, etalon is considered tuned to the laser. For example, the value $h_0$ can be set to 0, and $h_{err}$ can be set to 0.05 (about 5% asymmetry). Spectrum, shown in FIG. 16 has a=0.346 pm and b=0.461 pm. That means, its assymetry value is h =0.143, which is bigger than $h_0 + h_{err}$, which means, the FSR of the etalon output coupler should be reduced. The reduction of the FSR will shift the maximum towards the shorter wavelengths, which will reduce the asymmetry of the spectrum. The flow chart implementing this algorithm is shown in FIG. 17.

Fourth Preferred Alignment Technique

Another embodiment of the present invention is shown in FIG. 18. In this embodiment, only one spectrometer 84 is used, which provides the data for symmetry analysis as well as control of the laser absolute wavelength and its bandwidth. The laser wavelength is selected using a prior art technique of pivoting mirror 74 until the laser peak wavelength is at the desired value as measured by spectrometer 84 which may be configured as described in U.S. Pat. Nos. 5,025,445 and 5,420,877 to measure both absolute wavelength and spectral shape. The symmetry analysis of the spectrum and the etalon tuning is done in a manner similar to the third embodiment.

Although this very narrow band laser has been described with reference to a particular embodiment, it is to be appreciated that various adaptations and modifications may be made. For example, the high resolution grating spectrometer can be used to analyze special symmetry and/or absolute wavelength and bandwidth measurements. Also, the symmetry can be analyzed using different techniques, including using different levels and/or using integrated parameters, such as left and right spectral integral, the central maximum can be calculated as a middle point at some level, such as 50% or 90% level, etc. Also, this invention can be used with KrF, ArF and other excimer lasers, as well as with $F_2$ molecular gas laser. The techniques described for use on a KrF laser which operates at a nominal wavelength can also be applied to ArF lasers; however, the optics must be designed for 193 nm. In addition, to pressure-tuned etalons and piezoelectric-tuned etalons, there are commercially available etalons which are compression-tuned using mechanical force to widen or narrow the gap between the plates of the etalon. Etalons with reflectances other than 4% could be used. In some applications, it may not be necessary to tune the etalon and an etalon with a fixed spacing and fixed index of refraction could be used. In this case, the grating would be tuned with mirror 76 to match one of the etalon reflection peaks. Preferably, however, the reflectance of the reflecting surfaces should be between about 1 and about 20%. Persons skilled in the art will recognize that the grating based line narrowing module described above could be replaced with many other prior art line narrowing modules, such as modules comprised of a plurality of prisms and a totally reflecting mirror, a diffraction grating without beam expanders, and a diffraction grating and a totally reflecting mirror. Transmissive etalons could also be included in the line narrowing module. Therefore, the invention is only to be limited by the appended claims.

That which is claimed is:

1. A process for tuning a narrow band gas discharge laser defining a gain medium and equipped with tunable grating based line narrowing module and a tunable etalon based output coupler, said process comprising the steps of:

A. operating the laser;

B. adjusting said tunable grating to reflect back into said gain medium light at a first narrow range of wavelength;

C. adjusting said tunable etalon based output coupler to reflect back into said gain medium light at a second narrow range of wavelengths;

D. measuring the spectral characteristics of a beam produced by a laser;

E. tuning said tunable grating based line narrowing module and said tunable output coupler to produce desired beam spectral characteristics.

2. A process as in claim 1 wherein said beam is a beam transmitted by said output coupler.

3. A process as in claim 1 wherein steps of measuring is performed with an etalon based spectrometer.

4. A process as in claim 3 wherein said desired spectral characteristics is a beam spectrum having a single peak with minimum distortion due to mismatch of said tunable grating based line narrowing module and said tunable etalon based output coupler.

5. A process as in claim 1 wherein said beam is a beam reflected by said tunable etalon based output coupler.

6. A process as in claim 5 wherein said desired spectral characteristics is a beam spectrum having a single peak with minimum distortion due to mismatch of said tunable grating based line narrowing module and said tunable etalon based output coupler.

7. A process as in claim 1 wherein said laser comprises an automatic wavelength control wherein said tuning step comprises the substeps of:

A) tuning said tunable grating based line narrowing module to provide maximum reflection at a desired wavelength, B) providing feedback control for said tunable etalon based output coupler to automatically adjust said output coupler to provide maximum reflection at the maximum reflection of said tunable grating based line narrowing module, C) automatically tuning said tunable etalon based output coupler to provide maximum reflection at said desired wavelength utilizing said feedback control.

8. A process as in claim 7 wherein said desired wavelength is selected by an operator.

* * * * *